United States Patent
Pathak et al.

(10) Patent No.: US 8,166,427 B1
(45) Date of Patent: Apr. 24, 2012

(54) TRACING AND REPORTING REGISTERS REMOVED DURING SYNTHESIS

(75) Inventors: Swatiben Ruturaj Pathak, Fremont, CA (US); Babette Van Antwerpen, Mountain View, CA (US); Michael D. Hutton, Mountain View, CA (US); Andrew Leaver, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 635 days.

(21) Appl. No.: 12/044,926

(22) Filed: Mar. 7, 2008

Related U.S. Application Data

(60) Provisional application No. 60/894,178, filed on Mar. 9, 2007.

(51) Int. Cl.
*G06F 17/50* (2006.01)

(52) U.S. Cl. .................................. 716/104; 716/136

(58) Field of Classification Search .................. 716/1, 2, 716/4, 5, 18, 106, 107.136, 104; 714/30, 714/724
See application file for complete search history.

(56) References Cited

U.S. PATENT DOCUMENTS

| | | | | |
|---|---|---|---|---|
| 6,237,132 | B1* | 5/2001 | Dean et al. | 716/18 |
| 7,100,141 | B1* | 8/2006 | Ratchev et al. | 716/117 |
| 7,315,990 | B2* | 1/2008 | Archambeault et al. | 716/1 |
| 2005/0155008 | A1* | 7/2005 | Archambeault et al. | 716/11 |
| 2006/0010342 | A1* | 1/2006 | Kanamaru | 714/7 |
| 2006/0132416 | A1* | 6/2006 | Lu | 345/98 |
| 2006/0282250 | A1* | 12/2006 | Matsuda | 703/14 |

* cited by examiner

*Primary Examiner* — Vuthe Siek
(74) *Attorney, Agent, or Firm* — Ropes & Gray LLP

(57) ABSTRACT

Circuits, methods, software, and apparatus that track the removal of, reasons for, and consequence of the removal of registers or other circuitry during the synthesis of electronic circuits. An exemplary embodiment of the present invention tracks the removal of registers and determines why the registers were removed. This information is then provided in an efficient manner for design debugging purposes.

27 Claims, 22 Drawing Sheets

| NODE NAME | REMOVAL REASON | FANIN NODES | FANOUT NODES | FANOUTS' FANIN NODES | FANIN-BLAME NODES | FANOUT-BLAME NODES | POST PROCESSING |
|---|---|---|---|---|---|---|---|
| REGB | STUCK, NO CLK | DATA2 | REGC | REGA | NONE | NONE | ROOT CAUSE |
| REGA | LOST FANOUTS | DATA1, CLK | REGC | REGB | NONE | REGB | VICTIM OF REGB |
| REGC | STUCK, NO D | REGA, REGB, CLK | VOUT | | REGB | NONE | VICTIM OF REGB |

FIGURE 5E

| Registers Removed During Synthesis | |
|---|---|
| Register name | Reason for Removal |
| 1 inst7 | Stuck at GND due to stuck port clock |
| 2 inst1 | Lost fanout |
| 3 inst8 | Lost fanout |
| 4 inst3 | Lost fanout |
| 5 inst2 | Lost fanout |
| 6 inst6 | Lost fanout |
| 7 inst11 | Stuck at GND due to stuck port data_in |
| 8 Total Number of Removed Registers = 7 | |

Compilation Report
- Legal Notice
- Flow Summary
- Flow Settings
- Flow Non-Default Global Settings
- Flow Elapsed Time
- Flow Log
- Analysis & Synthesis
  - Summary
  - Settings
  - Source Files Read
  - Resource Usage Summary
  - Resource Utilization by Entity
  - Optimization Results
  - Register Statistics
    - Registers Removed During Synthesis
    - Removed Registers Triggering Further
    - General Register Statistics
  - INI Usage
  - Messages

FIG. 8

| Removed Registers Triggering Further Register Optimizations | | |
|---|---|---|
| Register name | Reason for Removal | Registers Removed due to This Register |
| 1 inst7 | Stuck at GND due to stuck port clock | inst1, inst6, inst11 |
| 2 inst8 | Lost fanouts | inst3, inst2 |

Name of the Optimized Register

- Compilation Report
  - Legal Notice
  - Flow Summary
  - Flow Settings
  - Flow Non-Default Global Settings
  - Flow Elapsed Time
  - Flow Log
  - Analysis & Synthesis
    - Summary
    - Settings
    - Source Files Read
    - Resource Usage Summary
    - Resource Utilization by Entity
    - Optimization Results
      - Register Statistics
      - Registers Removed During Synthesis
      - Removed Registers Triggering Further
      - General Register Statistics
    - INI Usage
    - Messages

FIG. 11

| Removed Registers Triggering Further Register Optimizations | | |
|---|---|---|
| Register name | Reason for Removal | Registers Removed due to This Register |
| 1 inst7 | Stuck at GND due to stuck port clock | inst1, inst6, inst11 |
| 2 inst8 | Lost fanouts | inst3, inst2 |

Reason of Optimization

- Compilation Report
  - Legal Notice
  - Flow Summary
  - Flow Settings
  - Flow Non-Default Global Settings
  - Flow Elapsed Time
  - Flow Log
  - Analysis & Synthesis
    - Summary
    - Settings
    - Source Files Read
    - Resource Usage Summary
    - Resource Utilization by Entity
    - Optimization Results
      - Register Statistics
        - Registers Removed During Synthesis
        - Removed Registers Triggering Further
        - General Register Statistics
    - INI Usage
  - Messages

FIG. 12

TRACING AND REPORTING REGISTERS REMOVED DURING SYNTHESIS

This application claims the benefit of U.S. provisional application No. 60/894,178, filed Mar. 9, 2007, which is incorporated by reference.

BACKGROUND

Embodiments of the present invention relate generally to circuit synthesis, and more particularly to tracking and providing information regarding circuits such as registers that are removed during circuit synthesis.

Integrated circuits are often designed intending to be implemented using a field programmable gate array (FPGA.) During this design, a circuit schematic and corresponding netlist are generated by a circuit designer, who may also be referred to as a user. The netlist is then fitted to an FPGA, such that the FPGA implements the user-designed circuitry. This fitting is referred to as synthesis.

As a part of synthesizing a user design, registers are both duplicated (split) and removed (deleted). There are at least two reasons why a register may be removed or deleted during this process. First, a user may make a connection that the user understands will be corrected by the synthesizer, where the correction involves the removal of one or more registers. A second and more troublesome removal can occur when a user makes a connection or logic error in the circuit design.

As an example of the first case, a user may purposely misconnect a 16-bit bus driver to a 14-bit input port with the understanding that this will leave two registers dangling, where the two bus driver registers are not used. It will be the user's expectation that the synthesizer will correct this error and that these two extra registers will be removed or swept away during the synthesizing process. It is often convenient for the user to simply connect circuits in this way and allow the synthesis tool to react appropriately.

Unfortunately, unintended design errors also cause registers to be removed in a way that may be contrary to the user's desire. For example, a common mistake is to neglect to connect an external clock pin to a register's internal clock node. Since the clock input for the register is not driven, its output is stuck at ground. This causes the registers to be removed, as its clock input never toggles and thus the output of the register is independent of its input. As the iterative aspect of synthesis progresses, the removal of this register may result in further registers being removed from the design.

When a register is removed, particularly when it is due to an unintended design error, it is very desirable that the user knows that it was removed, as well as the reason why it was removed and further consequences of its removal. Thus, what is needed are circuits, methods, software, and apparatus that track register or other circuit removal and provide easy to read information regarding the reason for removal.

SUMMARY

Accordingly, embodiments of the present invention provide circuits, methods, software, and apparatus that track the removal of, reasons for the removal of, and further consequences of the removal of registers or other circuits during the synthesis of integrated circuits.

An exemplary embodiment of the present invention tracks the removal of registers and determines why the registers were removed. Further information, such as what other registers or circuits where removed as a consequence of this earlier removal, may also be tracked. This information is then provided in an efficient manner to the user for design debugging and verification purposes.

Another exemplary embodiment of the present invention tracks the reason or "blame" for register removal during the synthesis process. A first register may have no other register to blame for its removal; it may be a root cause. That is, the conditions for its removal may exist before synthesis begins. For example, a register may be stuck because it has no data or clock input. Also, a register may not drive a circuit or device pin. Such a register is the root cause of its removal.

Other registers however, may have the conditions for their removal arise during the synthesis process. For example, a root cause register that provides a data or clock signal to a second register's input may be removed, thus causing the removal of the second register during synthesis. Also, a root-cause register that is a load for a third register may be removed, thus causing the removal of the third register. The second and third registers thus blame the root-cause register for their removal. The identity of the root-cause register, the blame associated with it, and the identity of victim registers that are removed as a result of the root-cause register's removal are useful information in design debugging.

Blame for removal may be tracked in several ways. A specific embodiment of the present invention tracks registers as they are removed. After a first register or root-cause register is removed, forward and backward paths are traversed from the removed root-cause register until other registers or device pins are reached, and these other registers (and possibly other circuits such as intervening logic) are possibly removed and blame attached. Also, registers found in the forward path from a root-cause register are identified. Paths from the inputs of these found registers are traced back to source registers or device pins, thus possibly leading to other register removal and attachment of blame. In typical embodiments of the present invention, a table is built at the beginning of synthesis, where register-to-register connections are stored. Later, as registers are removed, the table is modified by entering blame.

In a specific embodiment of the present invention, the required information is stored in the form of a table, which may be thought of as a unidirectional tree structure where each node points its blame at some other node, though in other embodiments of the present invention, other data structures can be used.

The information in this table may be post processed before being provided to the user. In one exemplary embodiment, data regarding root-cause registers, reasons for removal, and victims of the removal can be generated and provided to a user. Various steps to an algorithm may be completed in generating this information. For example, if a first register is stuck and blames the removal of a second fanout register that it was driving for its removal, that blame can be discounted during post processing. Also, if a first register does not fanout to a register or device pin and blames a removed second fanin register that was driving it for its removal, that blame can be discounted during post processing as well.

The post-processed information may be displayed in various ways. For example, a user interface may list the identity of a number of removed registers and the reasons for their removal. The user interface may also identify a number of root-cause registers and their victims. The information may be displayed by a graphical user interface on a monitor or display. Also, the information may be printed or provided in other ways to a user, electronic system, computer, or other device.

These lists may in turn be linked to databases such as schematics and layouts. For example, by passing a cursor over an item in a list, or right-clicking or otherwise identifying the item, information about the item may be found. For example, the item, such as a register, may be highlighted in a schematic or layout. Also, these schematics and layouts may be linked back to the post-processed information. For example, a removed path may be highlighted in a schematic. In various modes, when the cursor is over a removed register, or the register is right-clicked or otherwise identified, a floating box may appear indicating the reasons for removal. Other graphical aids may be incorporated according to various embodiments of the present invention.

While embodiments of the present invention are particularly well-suited to tracking the removal and reasons for the removal of registers, embodiments of the present invention may track the removal and reasons for the removal of other circuit devices and elements, such as latches and other synchronous circuits, combinatorial logic, and others.

Various embodiments of the present invention may incorporate one or more of these or the other features described herein. A better understanding of the nature and advantages of the present invention may be gained with reference to the following detailed description and the accompanying drawings.

BRIEF DESCRIPTION OF THE DRAWINGS

FIGS. 5A-5D illustrate circuitry that is synthesized according to an embodiment of the present invention, while FIG. 5E illustrates post processing that may be preformed on the data stored in FIGS. 3A-3D;

FIG. 8 illustrates an example of user interface output showing register names and reasons for removal for the circuitry of FIG. 7 according to an embodiment of the present invention;

FIG. 11 is another example illustrating a user interface according to an embodiment of the present invention;

FIG. 12 is another example illustrating a user interface according to an embodiment of the present invention.

DESCRIPTION OF EXEMPLARY EMBODIMENTS

Figure 1:
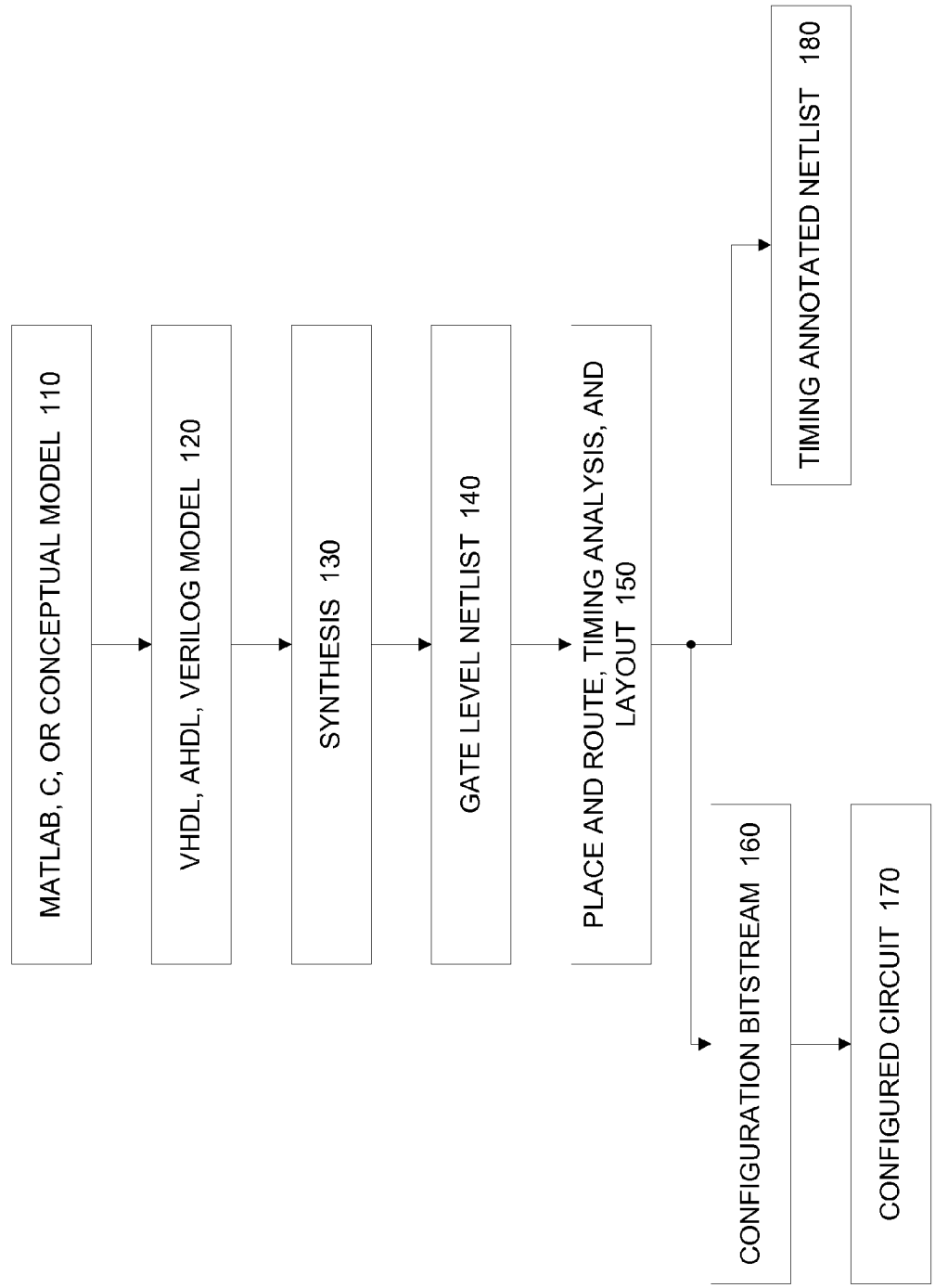
FIG. 1 is a flowchart illustrating acts in a design process that is improved by the incorporation of an embodiment of the present invention.

FIG. 1 is a flowchart illustrating acts in a design process that is improved by the incorporation of an embodiment of the present invention. This figure, as with all the included figures, is shown for exemplary purposes only and does not limit either the possible embodiments of the present invention or the claims. These activities may be implemented using one or more computers that read computer readable media and execute and store programs and their results.

To begin, a Matlab, C, conceptual, or other model file 110 is generated. This model 110 is a logical representation of a function to be performed by a final integrated circuit or integrated circuit portion 170. From this, a VHDL, Verilog, AHDL (Altera hardware description language), or other HDL model 120 (referred to as simply a VHDL or Verilog model) is generated. Alternately, the VHDL or Verilog model may be generated directly, skipping generation of the model file 110.

This model is synthesized in act 130 to generate a gate level netlist 140. Specifically, the VHDL or Verilog model 120 is converted to a non-optimized gate level netlist, made up of gate level logic functions such as OR, NAND, and other gates, as well as flip-flops, latches, pass gates, multiplexers, and other logic functions. This non-optimized netlist is "optimized," that is, improved or simplified, by the synthesis step 130. The optimized netlist undergoes a process referred to as technology mapping. For example, logic gates may be converted to look-up tables, product terms, or similar functions, particularly if the end integrated circuit is an FPGA or CPLD. The conversion of the VHDL or Verilog model 120 to a gate level netlist 140 may be referred to as circuit synthesis.

The gate level netlist 140 is then fitted to an integrated circuit layout using a place and route program. From the physical locations of the gates, and other information such as routing distances, a timing analysis may also be done in act 150. From the fitted design, an annotated netlist 180 including timing information may be generated. The place-and-route step also produces a configuration bitstream 160. This bitstream 160 can be used to configure an integrated circuit or circuit portion 170. Timing simulations may be performed on the gate level netlist 140, the timing annotated netlist 180, or both. The integrated circuit 170 may be a programmable logic device, field programmable gate array, ASIC, or other integrated circuit.

Again, during synthesis 130, registers and other circuits may be removed from the netlist. Often, this is fully anticipated by the user or designer. For example, a macrocell that is a 16-bit wide bus driver may be available for use. In a specific design, however, a user may only need the first 14 bits of this bus driver. Accordingly, the user may incorporate the 16-bit wide bus driver in a design, while connecting only 14 bits. Circuitry associated with the other two bits can be synthesized away during synthesis 130. This removal during synthesis is desirable to remove unused circuitry that would otherwise unnecessarily increase utilization and complicate the place-and-route step 150.

Typically registers are removed for one of three reasons. First, they may be removed because they are stuck, that is, their outputs cannot change. For example, a clock input may be disconnected or tied to a signal source that does not switch, such as a supply voltage. Also, a register may be stuck because its data input cannot change. For example, the data input may be disconnected or tied to a signal source that does not switch, again, such as a supply voltage. For example, if a register's data input is driven by a second register or logic gate that is removed during synthesis, that register will become stuck. A register whose output is stuck is not needed, because it can be replaced with a supply voltage such as ground or VCC, or other high or low logic level signal.

Second, a register may be removed because it does not drive a node. Such a register is not needed since it is not driving anything. For example, its output may be disconnected. Also, when a register drives another register or other logic gate that is removed, the driving register is no longer driving a node, that is, the register has become fanoutless.

Third, a register may be removed if the synthesizer merges it with another register in the circuit. For example, the synthesizer may transfer the fanouts of a first register to a second register and remove the first register. This may occur when two registers are identical in functionality, meaning they are duplicate registers. In this case, it is not necessary to preserve both the registers in the circuit. Accordingly, the synthesizer removes one of the duplicate registers and transfers its fanouts to the other register. This optimization is unlikely to be due to a user error. As a result, embodiments of the present invention typically track, post process, and report only stuck and fanoutless registers. However, various embodiments of the present invention do include the tracking, post processing, and reporting of merged registers as well.

It is noted that registers may be also split. For example, a register may be too heavily loaded, that is, it may have too many fanouts for proper operation, or a circuit may be easier to route if a register function is duplicated. Such registers may be split into multiple registers, each driving a smaller load. Various embodiments of the present invention may also include the tracking, post processing, and reporting of split registers.

Again, registers may become stuck or fanoutless on purpose, that is, the user fully intends them to be that way. However, at other times, a register can become stuck or fanoutless due to a connection error made by the user. Again, as one example, if a data or clock input is unintentionally left unconnected, the register becomes stuck and may be removed.

Often, one error, such as a clock input left floating, may have dramatic ramifications in the synthesis removal procedure. For example, hundreds or thousands of registers may be removed because of one mistaken connection. Conventionally, a list of these removed registers is provided to the user. However, it can be extremely difficult for a surprised user to determine the cause of removal of this large number of registers.

Accordingly, embodiments of the present invention track the removal of registers and report reasons for removal to the user. When a register is removed, various attributes relating to its inputs and associated circuitry, such as its fanins and fanouts, may be determined. These attributes can be post-processed to generate blame for removal. This data can be used to create a report that directs a user's attention to the register or registers of interest. One example illustrating how registers and associated circuitry are removed during synthesis is shown in the following figures.

Figure 2A:
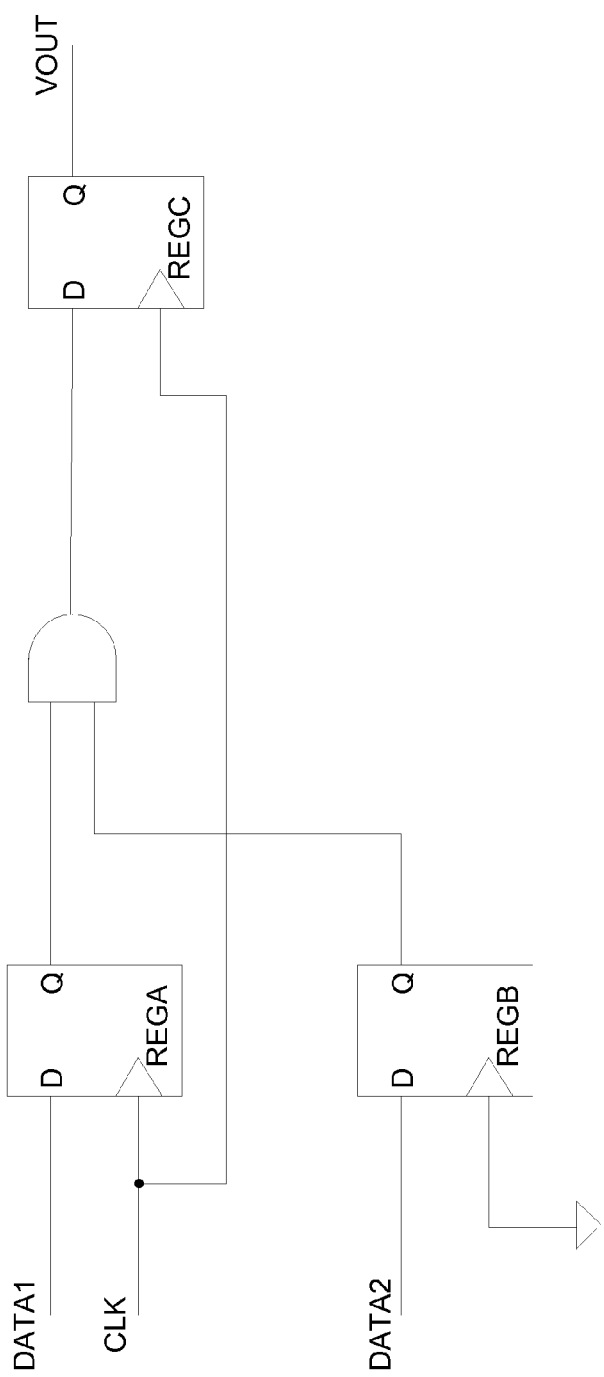
FIGS. 2A-2C illustrate a circuit portion that is synthesized according to an embodiment of the present invention.
Figure 2B:
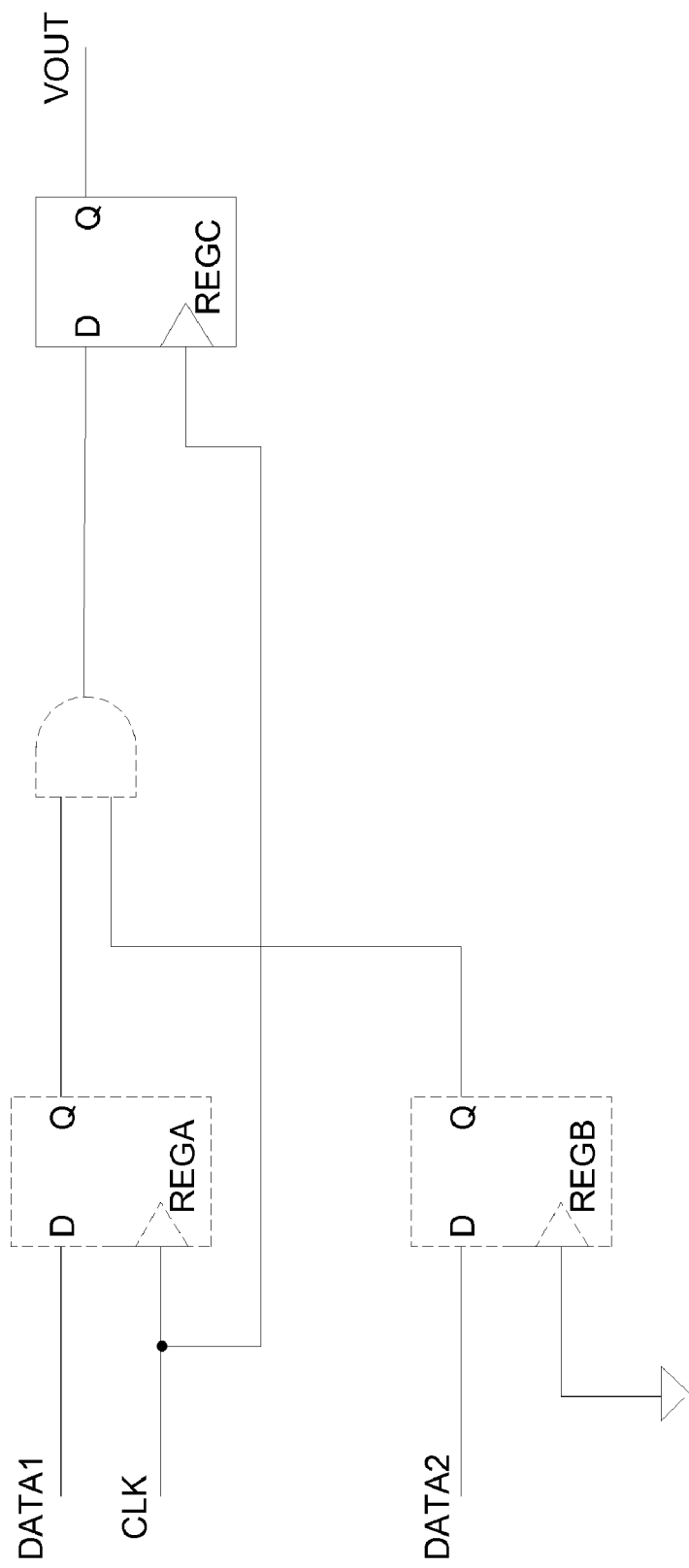
Figure 2C:
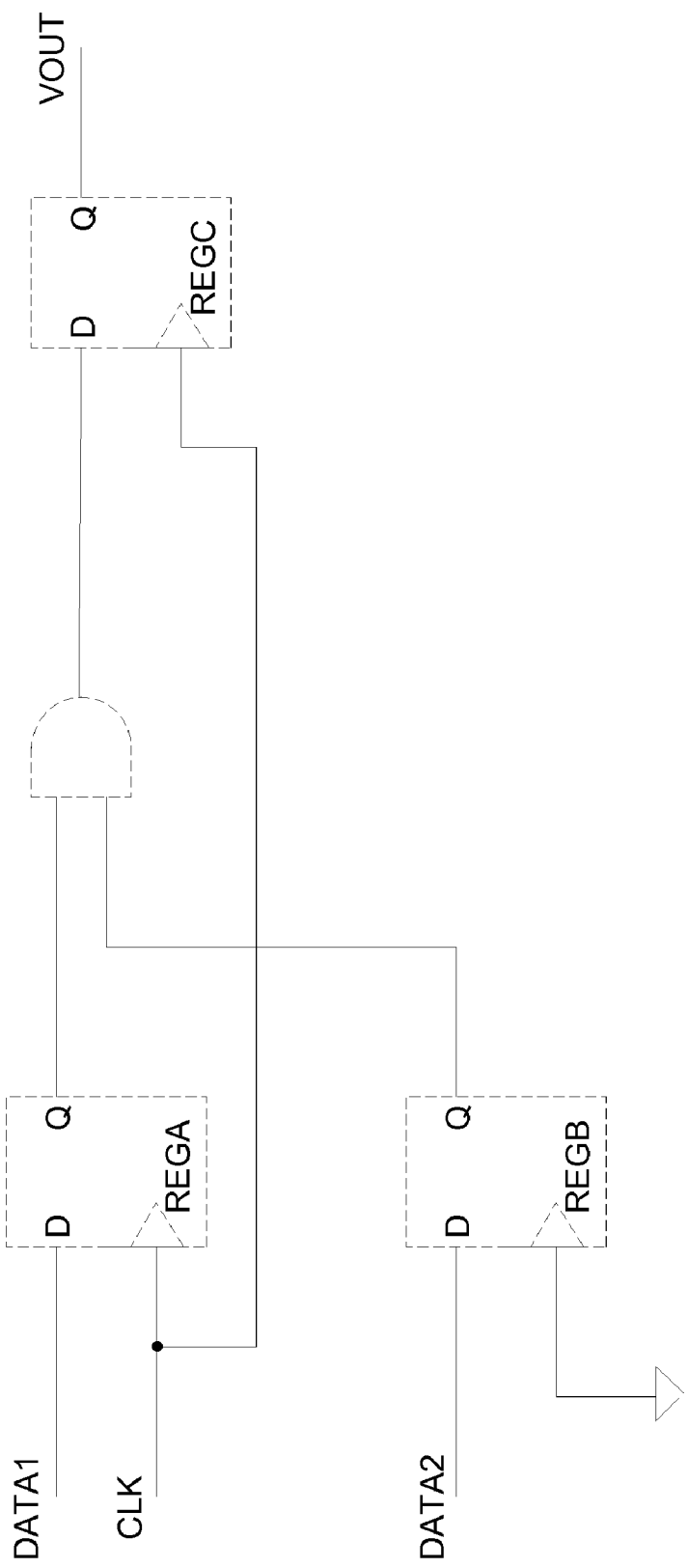

FIGS. 2A-2C illustrate a circuit portion that is synthesized according to an embodiment of the present invention. This example includes three registers, Register A, Register B, and Register C, and an AND gate. FIG. 2A illustrates the following: 1. REGB clock input is grounded. 2. REGB Q output cannot switch; it is stuck low. 3. Software removes REGB and traces forward from Q output (fanout) and backward from D and CLK inputs (fanin) 4. Trace depth can be set by software or user. For example, 10 logic gates. FIG. 2B illustrates the following: 1. AND gate has input at ground. AND gate removed. 2. REGA does not drive anything since AND gate has input at ground. 3. REGA removed. FIG. 2C illustrates the following: 1. Now REGC has no inputs (fanins). 2. REGC removed by software. In FIG. 2A, the clock input for Register B has been unintentionally grounded. Accordingly, the Q output of Register B cannot switch, that is, it is stuck. In various embodiment of the present invention, an output stuck in this way may be either stuck high or stuck low. Factors that may dictate whether an output is stuck high or stuck low may include the use of a power-on-reset signal, bleed currents, or other circuit techniques.

Accordingly, the synthesis software removes Register B. The synthesis software can then trace forward from the Q output, that is, it can determine fanouts of Register B, and backwards from the D and clock inputs of Register B, that is, it can determine Register B's fanin.

This forward and backward tracing can be open-ended, that is, the tracing can continue until a device pin or register is reached. Alternately, trace depth can be set by software or by the user. For example, a trace depth of 10 logic gates can be set, though in other embodiments of the present invention, other trace depths may be set. In such a situation, the synthesis tool traces from the output or input of a removed register through a number of logic gates up to 10 until a register or pin is reached. While on occasion, a register more than 10 gates away is not tracked properly, such a limitation may be useful in limiting the processing power required to perform the synthesis function.

In FIG. 2B, Register B has been removed and the synthesis software has traced forward to the AND gate. The output of the AND gate cannot switch because one input is at ground. Accordingly, the AND gate is removed. Once the AND gate is removed, Register A is fanoutless since it has lost its load, the AND gate it was driving. Accordingly, Register A is removed. The software continues tracing forward to the input of Register C In FIG. 2C, Register C is stuck as it has no signal at its D input. That is, the input of Register C is not connected to anything, and thus Register C is not needed. Accordingly, the synthesis software removes Register C. Again, embodiments of the present invention track information for each register's removal. In one example, the removed register's name, reason for removal, and interconnection information is tracked and stored. An example of this is shown in the following figures.

Figure 3A:
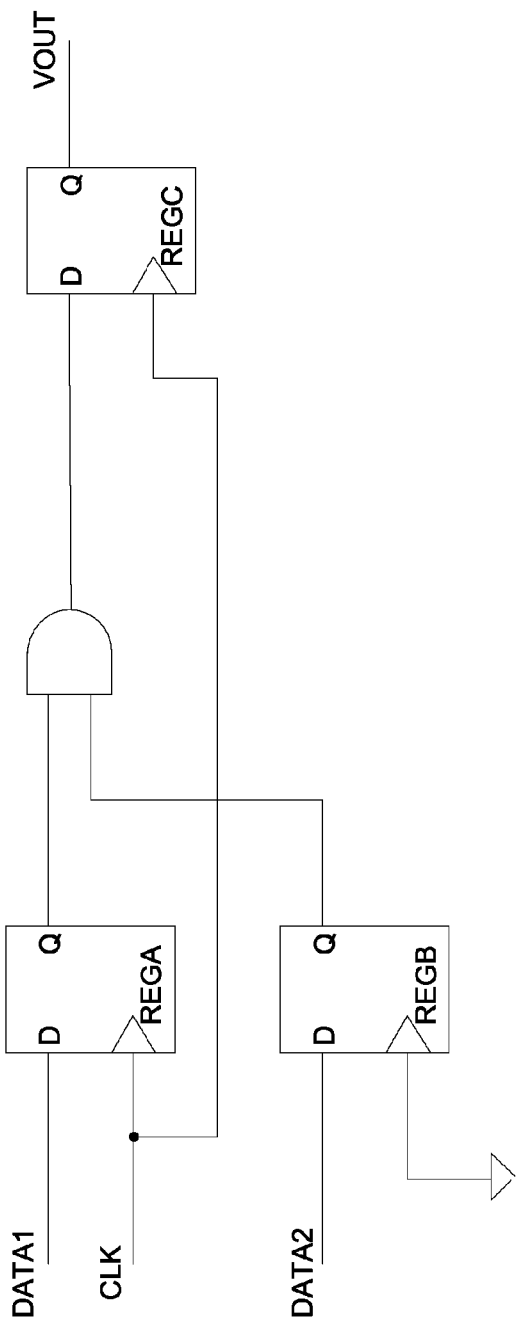
FIGS. 3A-3D illustrate the tracking and storing of data regarding register removal according to an embodiment of the present invention.

FIGS. 3A-3D illustrate the tracking and storing of data regarding register removal according to an embodiment of the present invention. For simplicity, the same circuitry including Register A, Register B, and Register C, and an intervening AND gate is shown. FIG. 3A illustrates the following: 1. Registers identified and listed as they are removed. 2. For each removed register, list reason for removal, fanin nodes, and fanout nodes. 3. For each removed register, for its fanout registers, trace back to their fanin registers and list as fanout's fanin nodes.

Figure 3B:
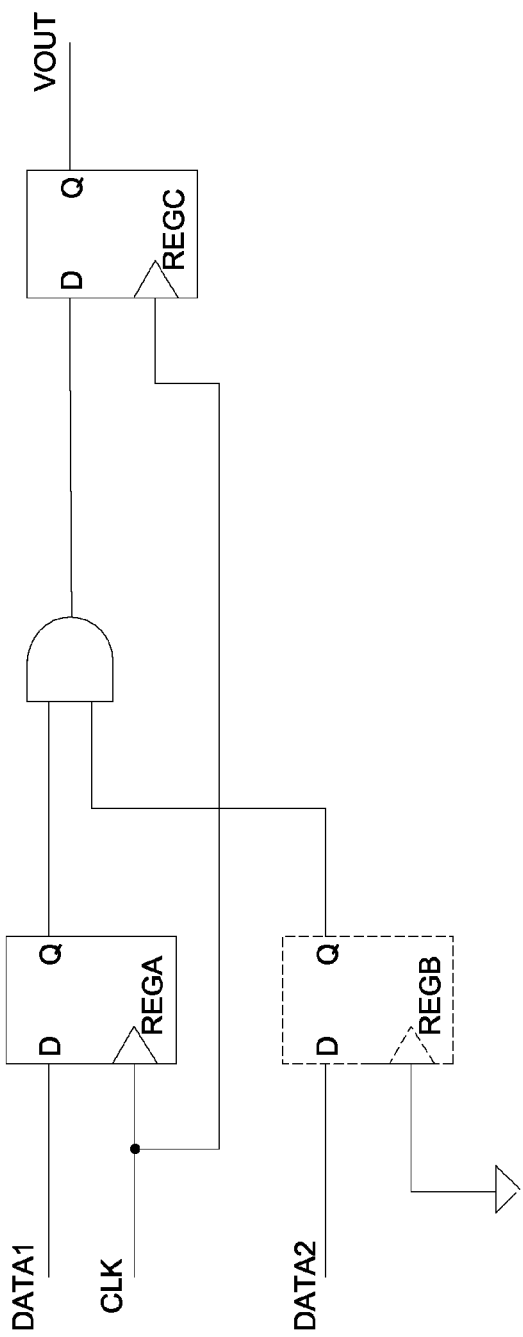
Figure 3C:
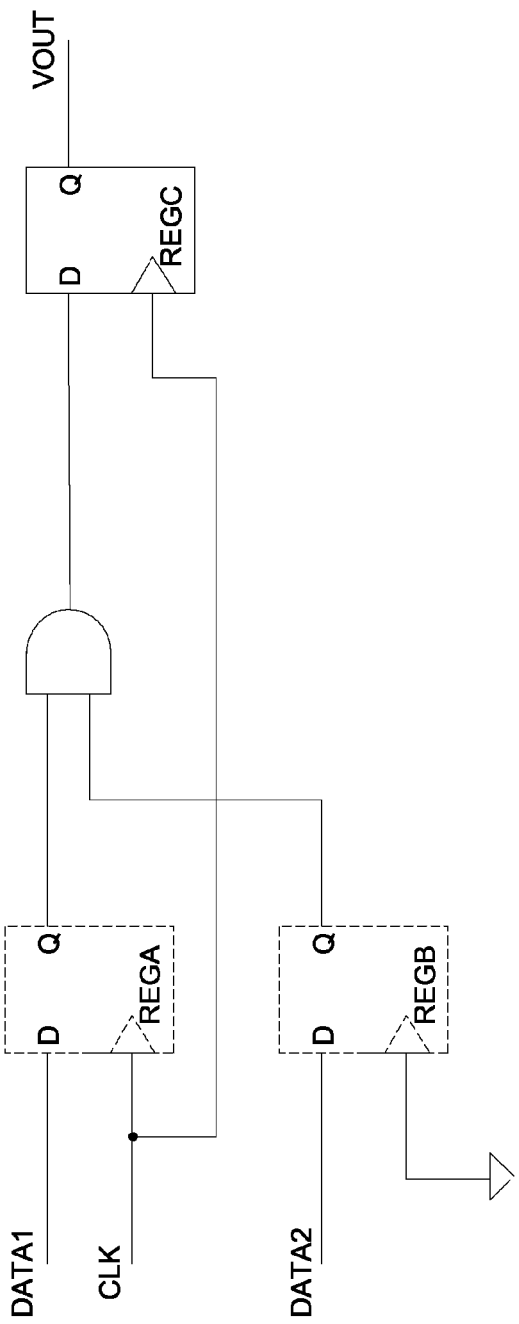
Figure 3D:
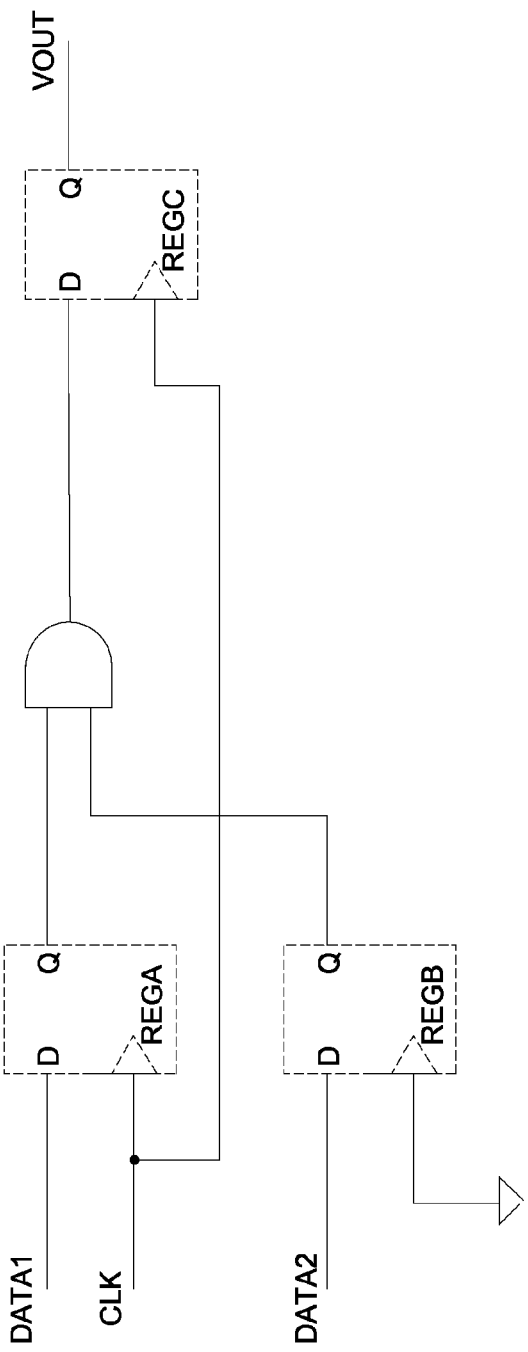

FIG. 3B illustrates the following: 1. REGB is removed as stuck. 2. REGB entered in table. Reason listed as stuck and entered in table. 3. Fanin node, fanout node, and fanout's fanin node entered in table for REGB. FIG. 3C illustrates the following: 1. REGA is removed for having no fanout. REGA entered in table. 2. Reason for REGA removal, fanin node, fanout node, and fanout's fanin node entered in table. 3. Order of removal is maintained in table. FIG. 3D illustrates the following: 1. REGC is removed. Reason entered in table. 2. REGC's fanin nodes and fanout node entered in table. 3. Order of removal is maintained in table.

In FIG. 3A, registers in the circuit are identified and listed as they are removed. The order in which they are removed is maintained for use in post processing, which will occur once the synthesis is complete. For each removed register, the removed register's fanin and fanout nodes are identified and listed. For each removed register, for its fanout registers, the software traces back to their (the fanout registers) fanin registers and lists these as fanout's fanin registers.

In FIG. 3B, the synthesizer begins removing registers. Again, Register B is stuck since it has no clock input. Accordingly, Register B is entered in the table. The reason for its removal is listed as well. The fanin nodes, fanout nodes, and fanout's fanin nodes are entered in the table as well.

In FIG. 3C, Register A is removed. Again, this removal is caused by the removal of the AND gate, that is, Register A is now fanoutless. Accordingly, Register A is entered in the table. Its corresponding reason, fanin, fanout, and fanout's fanin nodes are entered as well. Again, order of removal is maintained.

In FIG. 3D, register C is removed as being stuck, it has no D input. Accordingly, Register C is entered in the table. Its corresponding reason, fanin, fanout, and fanout's fanin nodes are entered. Again, order of removal is once again maintained.

Various embodiments of the present invention may track some or all of this and other information. An exemplary algorithm that may be used by embodiments of the present invention is shown in the following figure.

Figure 4:
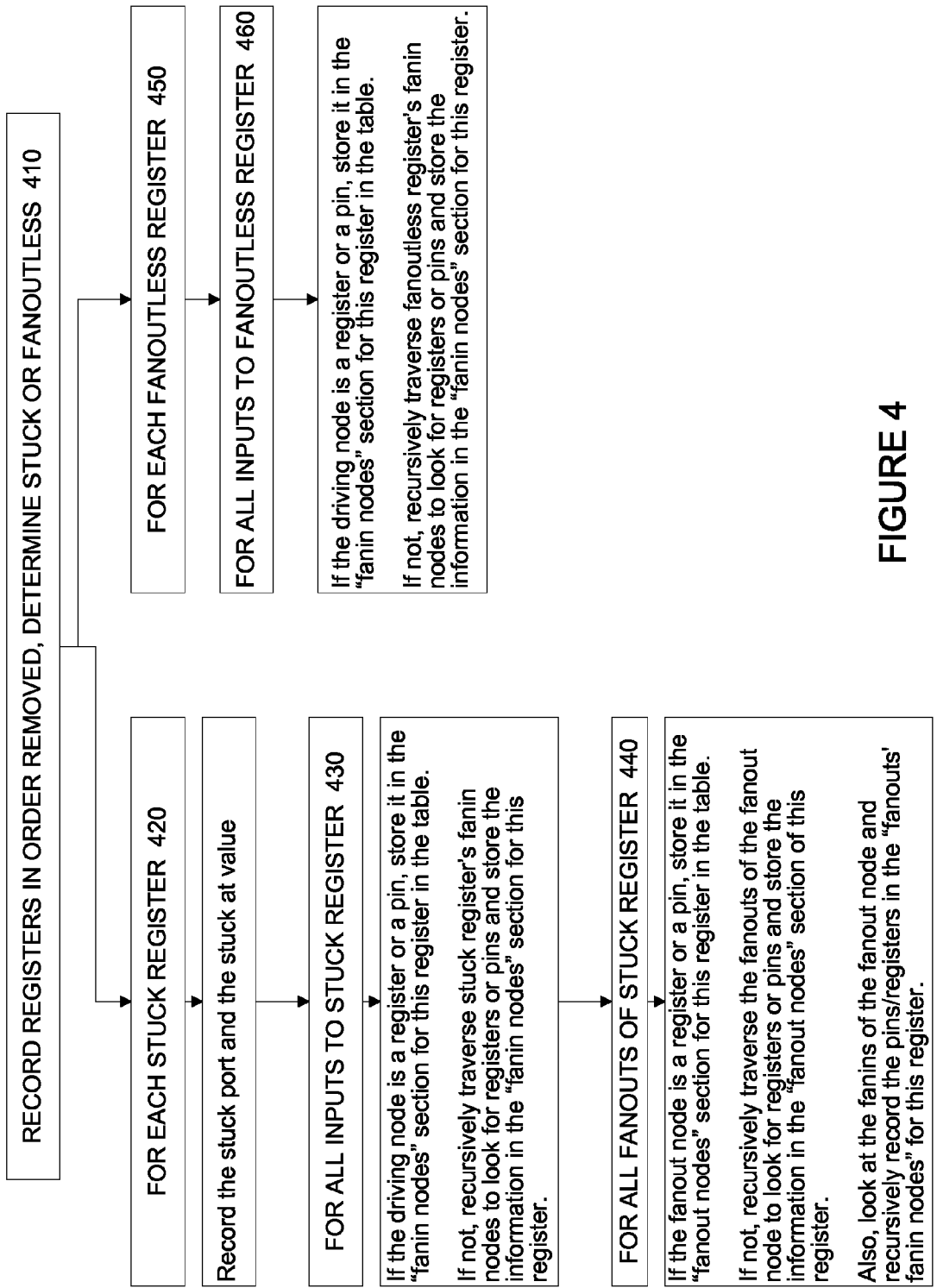
FIG. 4 is a flowchart illustrating a method of tracking and storing data during register removal according to an embodiment of the present invention.

FIG. 4 is a flowchart illustrating a method of tracking and storing data during register removal according to an embodiment of the present invention. In act 410, registers are recorded in the order in which they are removed, and it is determined whether they are stuck or fanoutless.

For each stuck register in act 420, the stuck port and stuck at value are recorded. For all inputs to the stuck register in act 430, if the driving node is a register or a pin, it is stored in the fanin node's entry for the removed register in the table. If the driving node is not a register or a pin, the stuck register's fanin nodes are recursively traversed until registers or pins are reached, and this information is stored in the fanin node's entry for the removed register. For all fanouts of the stuck register in act 440, if the fanout node is a register or a pin, it is stored in the fanout node's entry for the removed register. If the fanout node is not a register or a pin, the circuit is traversed until registers or pins are reached, and this information is stored in the fanout node's entry for the removed register. Also, the fanouts of the fanin node are traversed until pins and registers are reached, and these pins and registers are recorded in the fanout's fanin node's entry for the register.

For each fanoutless register in act 450, its inputs are found in act 460. If a driving node is a register or pin, it is stored in the fanin node's entry for the removed register. If the driving node is not a register or pin, the fanoutless register's fanin nodes are traversed to look for registers or pins, and this information is stored in the fanin node's entry for the removed register.

Once circuit synthesis is complete, the information tabulated above may be post processed and provided to the user. As part of this post processing, blame can be attached for register or other circuit removal. Again, two types of blame may be attached according to embodiments of the present invention. Specifically, fanin blame and fanout blame may be generated during post processing. This information may then be used to provide more accurate and useful results to a user regarding register removal during synthesis. An example is shown in the following figures.

Figure 5A:
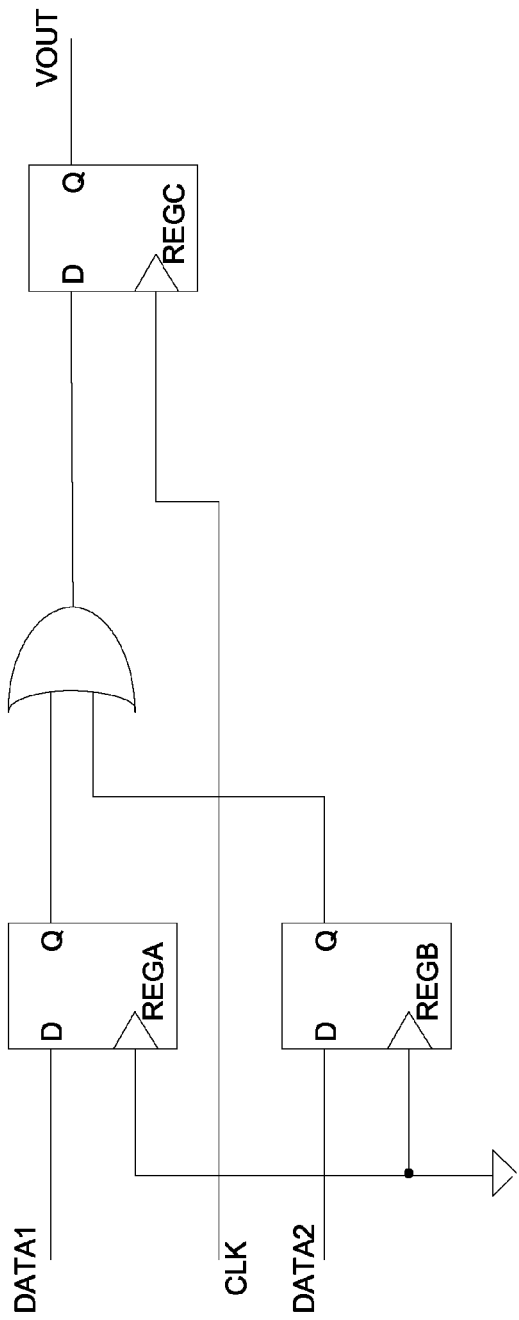
Figure 5B:
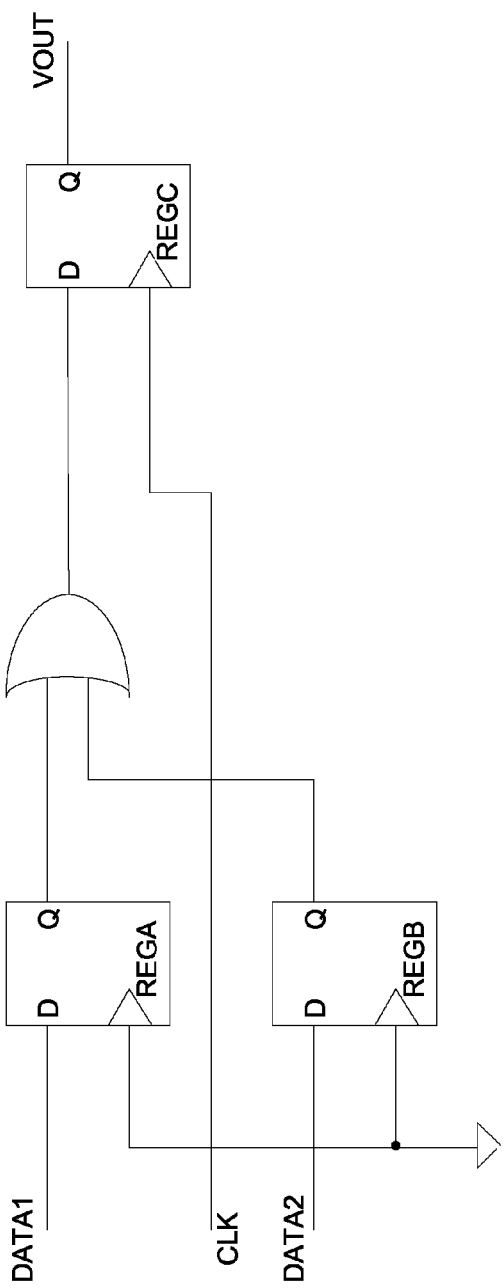
Figure 5C:
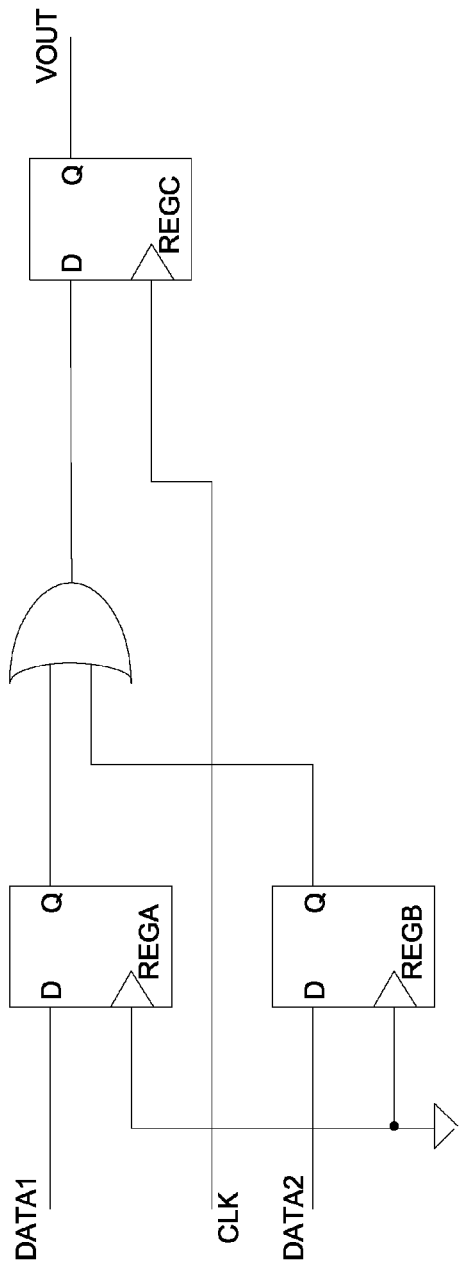
Figure 5D:
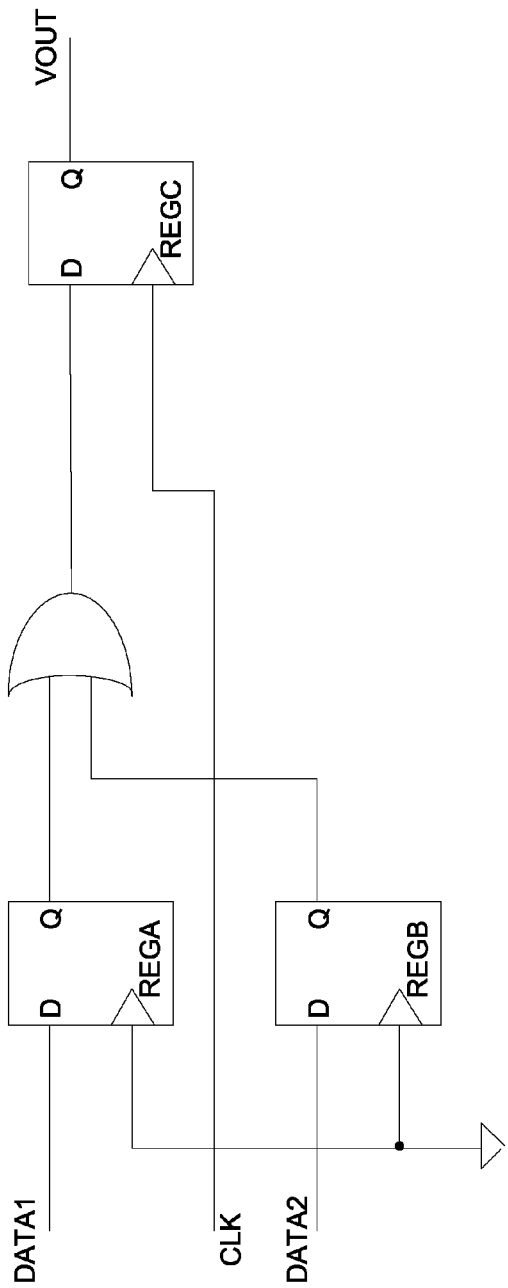

FIGS. 5A-5D illustrate circuitry that is synthesized according to an embodiment of the present invention. FIG. 5A illustrates the following: 1. During synthesis, REGA removed first. Reason, fanin, fanout, and fanout's fanin nodes entered. 2. REGB removed second. Reason, fanin, fanout, and fanout's fanin nodes entered. 3. REGC removed third. Reason, fanin, fanout, and fanout's fanin nodes entered. 4. Order of removal maintained. FIG. 5B illustrates the following: During post-processing: 1. REGA was removed first, so NONE entered in fanin and fanout blame node entries. REGA is a root cause. 2. REGA is entered in fanin-blame node entry for all its fanouts, which is REGC. 3. REGA is entered in fanout-blame node entry for all its fanout's fanin nodes, which is REGB. FIG. 5C illustrates the following: 1. REGB was removed as stuck. Fanout-blame node is REGA. 2. Post processing recognizes a stuck register cannot blame a fanout register for its removal. 3. Accordingly, REGB listed as root cause even though REGA is fanout-blame node. 4. REGB would be listed as fanin-blame for its fanout, which is REGC. But REGA has been entered, no change to entry made. FIG. 5D illustrates the following: 1. REGC was removed as stuck and has REGA in fanin-blame node entry. 2. For blame for REGC removal, look to fanin-blame node. 3. REGC is a victim of REGA. In FIG. 5A, Register A's and Register B's clock inputs are grounded. In this particular example, Register A is removed first since it is stuck because its clock input is grounded. Similarly, Register B is removed, it is also stuck. Register C is also removed as it is stuck, it has no D input. The registers are listed in the order they are removed. The reasons for removal, fanin nodes, fanout nodes, and fanout's fanin nodes are entered. Once the circuit synthesis is complete, the tabularized information can be post processed and provided to the user. An example of this post processing follows.

In FIG. 5B, Register A was removed first. Accordingly, there is no other register to blame, so "NONE" is entered for its fanin-blame node and fanout-blame node. Register A is a root cause. Register A is entered in the fanin-blame node entry for all of its fanout nodes, in this example Register C. Register A is also entered in the fanout-blame node entry for all of its fanout's fanin nodes, in this example Register B.

In FIG. 5C, post processing recognizes that a register without a fanout cannot blame a fanin register for its removal. That is, a fanoutless register would be removed whether a fanin register was removed or not. Accordingly, Register B is listed as a root cause, even though Register A is entered as Register B's fanout-blame node. Register B would also be listed as fanin-blame for its fanout, which in this example is Register C. However, Register A has been entered as this already, and no change is made.

In FIG. 5D, Register C was removed as stuck and has Register A in its fanin-blame node entry. Accordingly, it is determined that Register C is a victim of Register A.

As another example of this post processing, the table generated in FIGS. 3A-3D is completed in the following figure. FIG. 5E illustrates the following: Table generated during synthesis in FIGS. 3A-3D is post-processed: 1. REGB was removed first, so no blame nodes. REGB is a root cause. 2. REGB entered as fanout-blame node for all its fanout's fanin nodes, in this case REGA. 3. REGB entered as fanin-blame node for all its fanouts, in this case REGC. 4. For REGA, removed for lost fanouts, look to fanout-blame node entry. REGA is victim of REGB. 5. For REGC, removed as stuck, look to fanin-blame node entry. REGC is victim of REGB.

In FIG. 5E, Register B was removed first, so it has none entered in its blame node entries. Register B is a root cause. Register B is entered as fanout-blame node for all its fanout's fanin nodes, in this example Register A. Register B is also entered as fanin-blame node for all its fanouts, in this example Register C. For Register A, which has lost its fanouts, the fanout-blame node entry is checked. Accordingly, it is determined that Register A is a victim of Register B's removal. For register C, removed as stuck, its fanin-blame node entry is checked. Accordingly, it is determined that Register C is also a victim of Register B.

Again, the post processor recognizes that a register without a fanout cannot blame a fanin register for its removal. That is, a fanoutless register would be removed regardless of its inputs. Similarly, no stuck register can blame a fanout register for its removal. That is, the stuck register would be removed whether the fanout register was removed or not. An example illustrating one algorithm that may be used for post processing is shown in the following figure.

Figure 6:
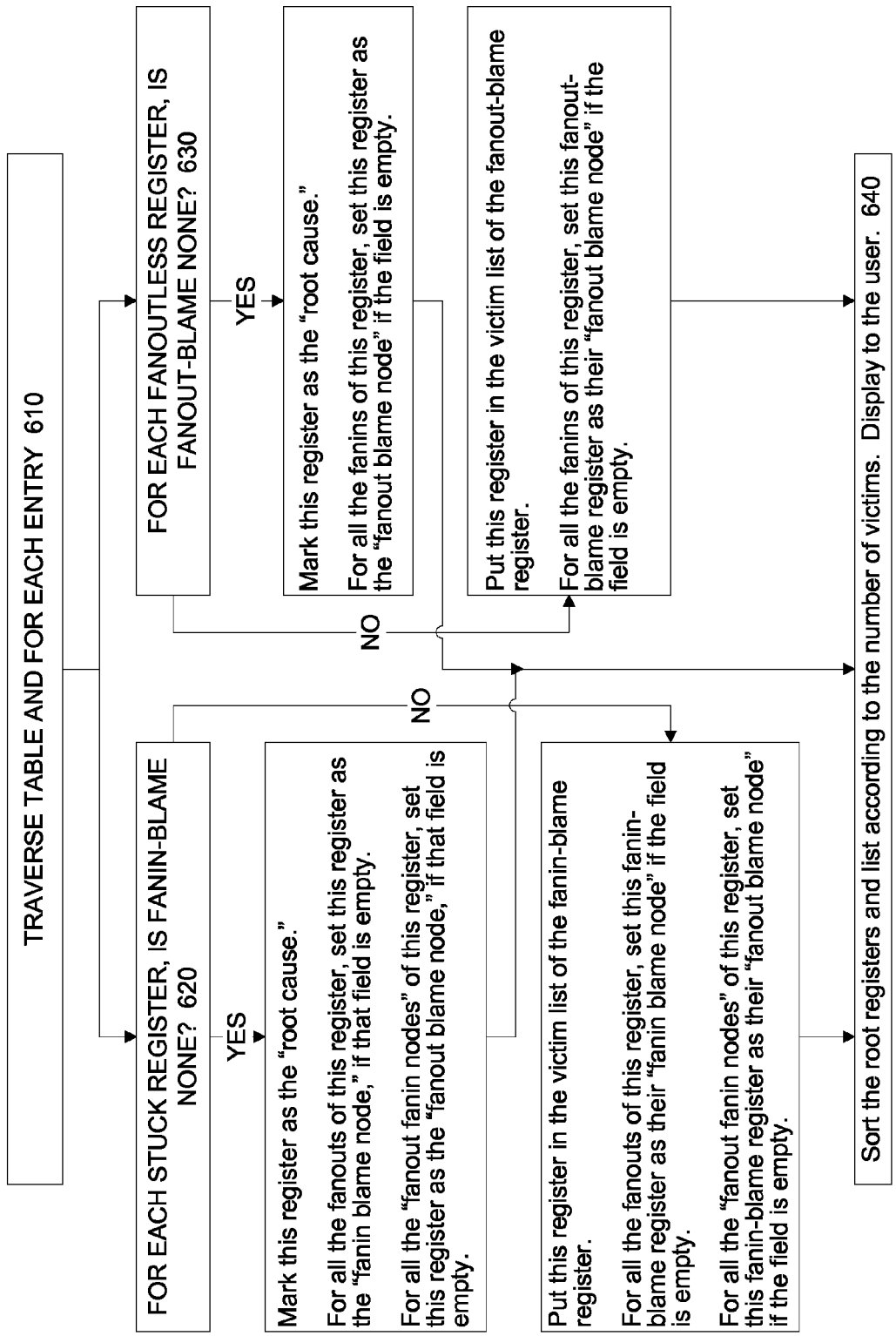
FIG. 6 illustrates an example of a post-processing algorithm that may be performed on register removal data according to an embodiment of the present invention.

FIG. 6 illustrates an example of a post-processing algorithm that may be performed on register removal data according to an embodiment of the present invention. In act 610, the table is traversed for each entry. For each stuck register, if its fanin blame is none in act 620, that register is marked as the root cause. For all the fanouts of this register, this register is set as the fanin blame node. For all the fanout's fanin nodes of this register, this register is set as the fanout blame node. If there is fanin blame for stuck register in act 620, this register is listed as a victim of the fanin blame register. For the fanouts of this register, this fanin blame register is entered as their fanin-blame node. Again, for this and the other entries, an entry may have been made previously during the circuit synthesis. In this example algorithm, that data is not overwritten, that is, this fanin blame register is entered as their fanin-blame node only if that entry is vacant. If it is occupied, the existing data is not overwritten. For all the fanout fanin nodes of this register, this fanin blame node register is set as their fanout blame node, if that entry is vacant.

For each fanoutless register, if the fanout blame is none in act 630, then the removed fanoutless register is marked as the root cause. For all fanins of this register, this register is set as the fanout blame node, if that field is empty. If there is blame in the fanout blame in act 630, this register is entered in the victim list of the fanout blame register. For all the fanins of this register, this fanout blame register is set as their fanout blame node, if that field is empty.

Once this process is complete, the root-cause registers can be sorted and listed according to the number of victims. This may be displayed to the user in act 640.

Again, embodiments of the present invention provide an easy-to-understand user interface. This user interface provides information such as which registers are removed and why they are removed. This information allows users to quickly zero in on circuit errors that are responsible for unexpected register removals. A circuit that may be used as an example to illustrate a user interface is shown in the following figure.

Figure 7:
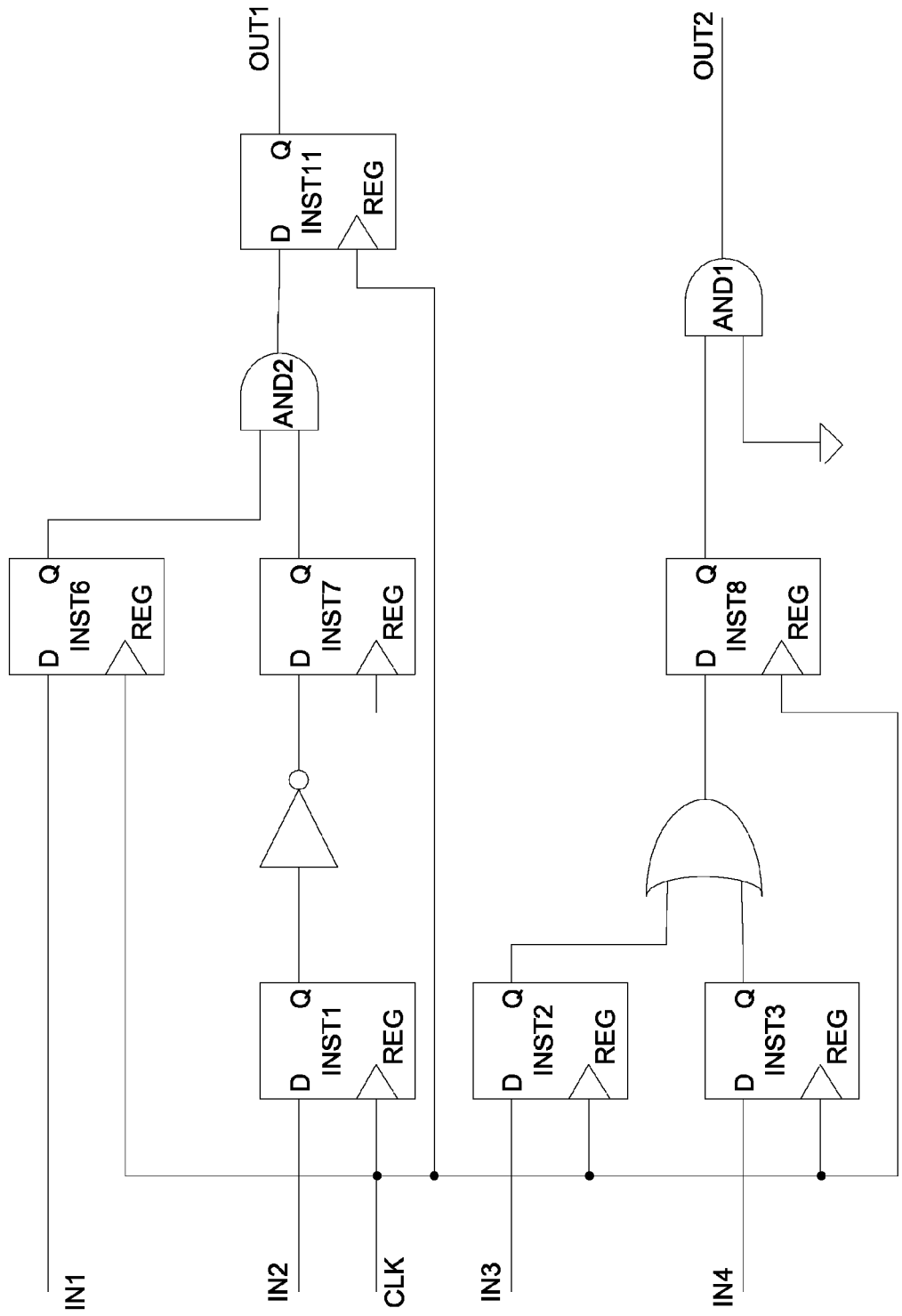
FIG. 7 illustrates circuitry that is removed during synthesis according to an embodiment of the present invention.

FIG. 7 illustrates circuitry that is removed during synthesis according to an embodiment of the present invention. This circuitry includes seven instances of registers and four logic gates. The register names and the reasons for their removal by synthesis software are shown in the following figure.

FIG. 8 illustrates an example of user interface output showing register names and reasons for removal for the circuitry of FIG. 7 according to an embodiment of the present invention. FIG. 8 illustrates the following: 1. INST7 clk is open. INST7 stuck at ground, removed. INST1 has no fanout, removed. 2. AND1 cannot switch, input at ground. INST8 has no fanout, removed. INST2 and INST3 no fanout, removed. 3. AND2 cannot switch, input at ground. INST6 has no fanout, removed. 4. INST11 has no D input, stuck at ground, removed. Specifically, the clock input to Instance 7 is open; it has been left unconnected. Accordingly, the output of Instance 7 is stuck at ground and thus the register is removed. Instance 1 has no fanout now and is thus removed. Also, AND1 cannot switch since it has an input at ground. Accordingly, Instance 8 has no fanout and is removed. Similarly, AND2 cannot switch since it now has an input at ground. Accordingly, Instance 6 has no fanout and is removed. Instance 11 has no input, and is therefore stuck at ground and removed.

In this example, Instance 7 and Instance 8 are the root causes of the removal of the circuitry in FIG. 7. These registers were stuck or had no fanout before any other circuit was removed during synthesis. Specifically, Instance 7 is stuck since its clock input is disconnected. Instance 8 has no fanout since AND1, which Instance 8 drives, has an input at ground. These registers, the reasons for removal, and their victims are listed in the following figure.

Figure 9:
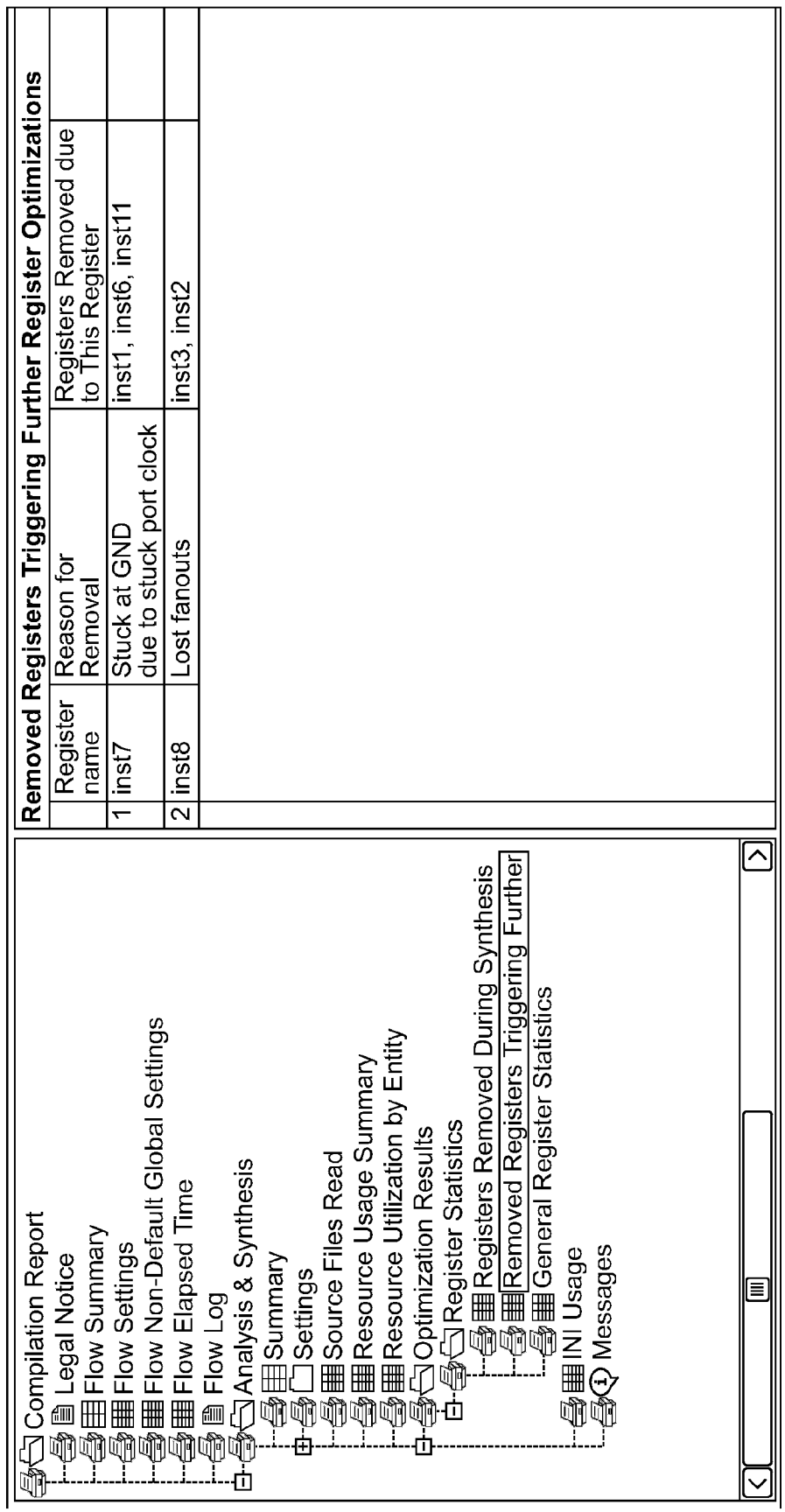
FIG. 9 illustrates a user interface that provides a list of removed registers, reasons for removal, and their victims, according to an embodiment of the present invention.

FIG. 9 illustrates a user interface that provides a list of removed registers, reasons for removal, and their victims, according to an embodiment of the present invention. FIG. 9 illustrates the following: 1. INST7 blamed for INST1, INST6, and INST11 removal. 2. INST8 blamed for INST2 and INST3 removal. 3. For simplicity and ease of use: If root-cause has no victims, it may be omitted from report for simplicity; Busses may be grouped together; and Size of table may be user or software controlled. 4. For simplicity or to protect encrypted IP, use attributes to either not remove registers, or not report register removal. Again, Instance 7 is stuck because its clock input is disconnected, and it is blamed for the removal of Instance 1, Instance 6, and Instance 11. Instance 8 is removed for having no fanouts, and Instance 8 is blamed for in the removal of Instance 3 and Instance 2.

This data may be configured and presented in different ways for simplicity and ease of use according to various embodiments of the present invention. For example, if a root cause register has no victims, it may be omitted from the report. Often, such registers are intended by the user to be removed by the synthesizer software. In such a situation, their listing serves no purpose and only complicates the report. For example, earlier, an example was discussed where two inputs of a bus driver might not be used. In such a situation, instead of listing these as separate registers, they may be combined. For example, if registers A1 and A2 are not used, they may be listed as one entry, for example as A[1:2]. Similarly, in some circumstances, the size of the table may become unwieldy. Accordingly, the user or software may limit the size of the table.

In these or other circumstances, protected or otherwise encrypted IP may be used. In such a situation, it may be undesirable to list the removed registers. Accordingly, attributes can be used to either not remove registers or to not report the register removal.

This user interface may link to other information. For example, these table entries may link to schematics, device layouts, or other databases. Such databases can include VHDL, Verilog, or other source file using another language. These databases may be reached by left or right clicking on appropriate table entries. Examples of this are shown in the following figures. Other embodiments of the present invention may provide this information in other ways, for example, the results may be printed. Alternately, the results may be provided in electronic format to another electronic computer or device.

Figure 10:
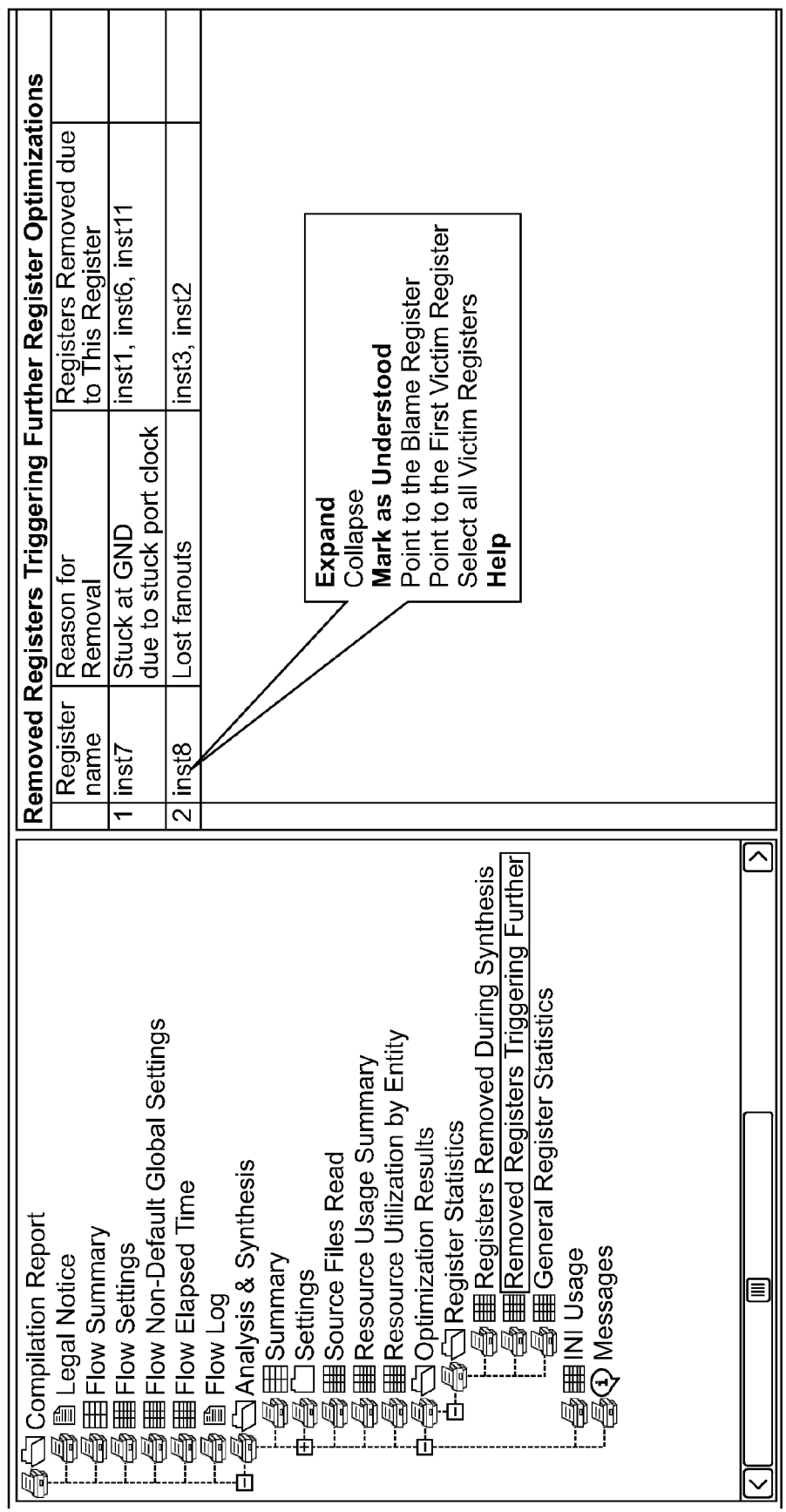
FIG. 10 illustrates an example of a user interface according to an embodiment of the present invention.

FIG. 10 illustrates an example of a user interface according to an embodiment of the present invention. FIG. 10 illustrates the following: 1. Right click brings up diagnostic messages. 2. Message options can link to schematics. In this example, right clicking on the name of a removed register brings up a list of possible options. Options can link to other databases, such as schematics or layout databases. In this example, the blame register, the first victim register, or all the victim registers can be selected. A help option is also available.

In this example, the removal of a register may be marked as understood. This may result in the removal of this register from the list. This is useful where a register's removal is anticipated by the user. Also, registers that are part of a bus may be individually listed (expanded) or as a unit (collapsed.)

FIG. 11 is another example illustrating a user interface according to an embodiment of the present invention. In this example, the removed register's name is shown.

FIG. 12 is another example illustrating a user interface according to an embodiment of the present invention. In this example, the reason for optimization is listed.

Figure 13:
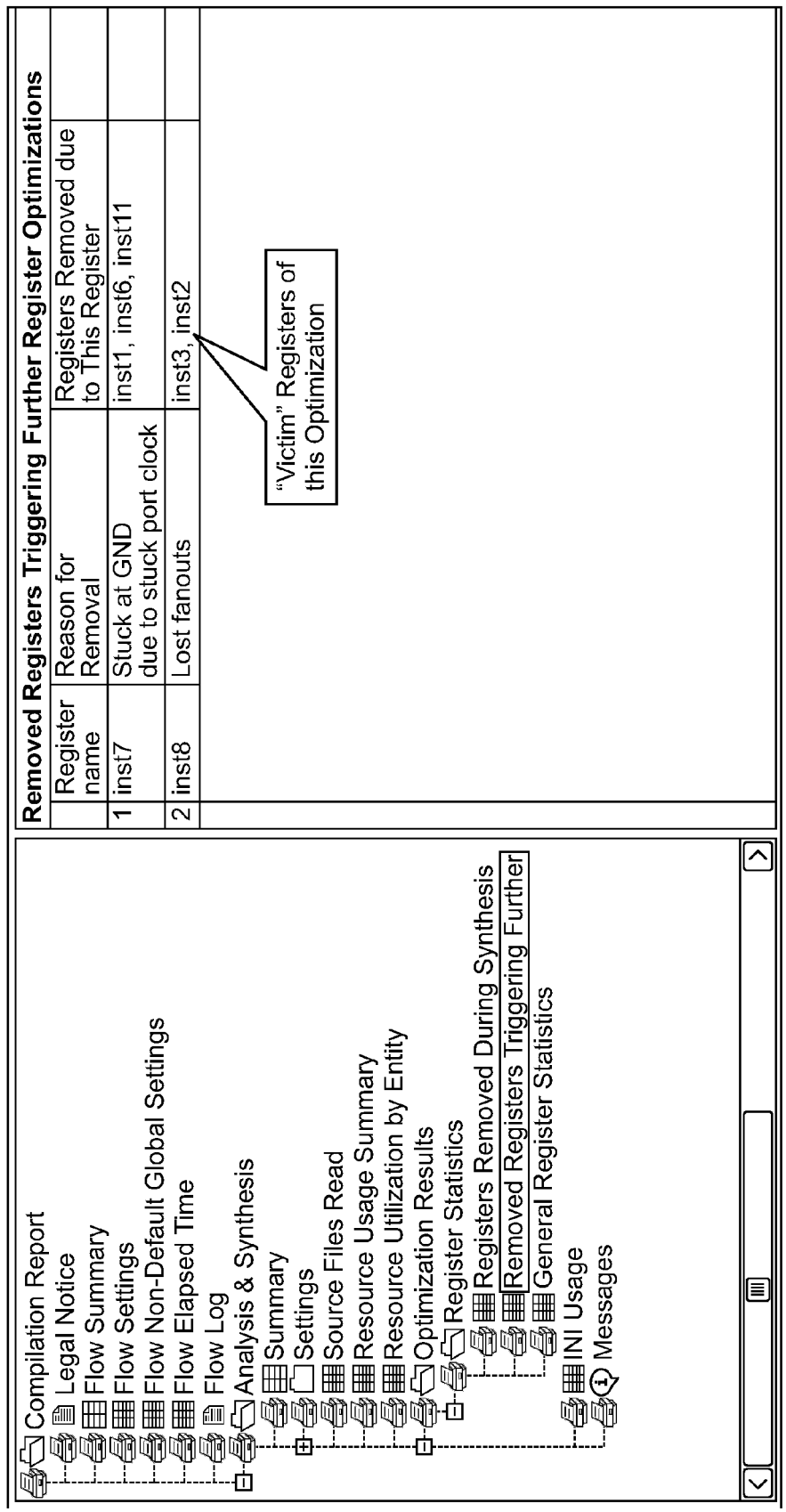
FIG. 13 as another example illustrating a user interface according to an embodiment of the present invention.

FIG. 13 is another example illustrating a user interface according to an embodiment of the present invention. In this example, the victim registers of this optimization are listed.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A system comprising a processor, the processor configured to:
   select a first component of an integrated circuit from a model of the integrated circuit during a synthesis stage;
   identify the first component as stuck during the synthesis stage and identify a second component as a blame component corresponding to the stuck first component;
   generate a message indicating that the first component is stuck and that the second component is the blame component corresponding to the stuck first component; and
   provide the message for rendering on a display.

2. The system of claim 1, wherein the message comprises a stuck value of the first component.

3. The system of claim 1, wherein the first component comprises a register.

4. The system of claim 1, wherein the first component comprises a plurality of registers.

5. The system of claim 1, wherein a format of the message is selected from the group consisting of a schematic, a layout, and a text source file.

6. The system of claim 1, wherein the first component is removed from the integrated circuit during the synthesis stage.

7. The system of claim 1, wherein the display presents the message in a graphical user interface.

8. The system of claim 1, wherein the message is printed.

9. A system comprising:
   a memory, the memory configured to store a list of descriptions of components of an integrated circuit during a synthesis stage; and
   a processor, the processor configured to:
      identify a first component of the integrated circuit as stuck during the synthesis stage and identify a second component as a blame component corresponding to the stuck first component;
      generate a description indicating that the first component is stuck and that the second component is the blame component corresponding to the stuck first component; and
      add the description to the list of descriptions.

10. The system of claim 9, wherein the description comprises a stuck value of the first component.

11. The system of claim 9, wherein the first component comprises a register.

12. The system of claim 9, wherein the first component comprises a plurality of registers.

13. The system of claim 9, wherein a format of the description is selected from the group consisting of a schematic, a layout, and a text source file.

14. The system of claim 9, wherein the processor is further configured to identify one of the descriptions in the list of descriptions as corresponding to a root-cause circuit.

15. The system of claim 9, wherein the list of descriptions is displayed using a graphical user interface.

16. The system of claim 9, wherein the list of descriptions is printed.

17. A method of generating circuit synthesis information, the method comprising:
   applying an input signal to a first circuit of an integrated circuit and measuring a corresponding output signal of the first circuit;
   determining that the corresponding output signal remains constant as the input signal is varied; and
   identifying, using a processor, a second circuit as a blame circuit corresponding to the first circuit, wherein the second circuit has an output port that is coupled to an input port of the first circuit;
   generating a message indicating that the second circuit is the blame circuit corresponding to the first circuit; and
   providing the message for rendering on a display.

18. The method of claim 17, further comprising:
   displaying a description of a third circuit, wherein the description indicates that the third circuit is a victim of the first circuit.

19. The method of claim 18, wherein the first circuit is removed from the integrated circuit during a circuit synthesis.

20. The method of claim 18, wherein the first, second, and third circuits are each removed from the integrated circuit during a circuit synthesis.

21. The method of claim 20, further comprising displaying the identity of the second circuit, and an identity of the first circuit and the third circuit.

22. The method of claim 18, wherein the first circuit is a logic gate.

23. The method of claim 18, wherein a supply voltage is coupled to an input port of the first circuit.

24. The method of claim 18, wherein the first circuit is a register.

25. The method of claim 18, wherein the first circuit is a synchronous circuit.

26. The method of claim 17, wherein an identity of the first circuit is listed in tabular data-structure to associate the first circuit with the second and third circuits.

27. The method of claim 26, wherein a post-processing operation traverses the tabular data-structure to determine an initial cause for why the output signal remains constant as the input signal is varied of the first circuit.

* * * * *